(12) United States Patent
Kelly et al.

(10) Patent No.: US 7,444,603 B1
(45) Date of Patent: Oct. 28, 2008

(54) TRANSFORMATION OF GRAPHS REPRESENTING AN ELECTRONIC DESIGN IN A HIGH MODELING SYSTEM

(75) Inventors: Sean A. Kelly, Boulder, CO (US); Roger B. Milne, Boulder, CO (US); Jeffrey D. Stroomer, Lafayette, CO (US); Jonathan B. Ballagh, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 206 days.

(21) Appl. No.: 11/639,547

(22) Filed: Dec. 15, 2006

(51) Int. Cl.
*G06F 17/50* (2006.01)
(52) U.S. Cl. .............................. 716/3; 716/2
(58) Field of Classification Search ................. 716/1–4
See application file for complete search history.

(56) References Cited

U.S. PATENT DOCUMENTS 5,528,508 A * 6/1996 Russell et al. ................. 716/8
7,089,511 B2 * 8/2006 Allen et al. ..................... 716/3
7,299,458 B2 * 11/2007 Hammes ..................... 717/133

* cited by examiner

*Primary Examiner*—Thuan Do
*Assistant Examiner*—Binh C Tat
(74) *Attorney, Agent, or Firm*—LeRoy D. Maunu; Lois D. Cartier

(57) ABSTRACT

Methods and apparatus are provided for processing an electronic design in a high level modeling system. A first graph is generated, with the nodes representing basic elements of the electronic design and including a shared node representing the basic element of a block, a port, or a network of the electronic design. Multiple second graphs are generated modeling different aspects of the electronic design. A first and second member of the nodes and edges of respective ones of the second graphs are each associated with the shared node of the first graph. The different aspects of the electronic design of the second-type graphs transformed, with a first attribute of one of the second graphs written to the shared node using the first member, and a second attribute of another of the second graphs determined as a function of the first attribute read from the shared node using the second member.

16 Claims, 6 Drawing Sheets

TRANSFORMATION OF GRAPHS REPRESENTING AN ELECTRONIC DESIGN IN A HIGH MODELING SYSTEM

FIELD OF THE INVENTION

The present invention generally relates to high-level modeling systems.

BACKGROUND

A designer may use a high-level modeling system (HLMS), such as the System Generator HLMS available from Xilinx Inc., to develop an electronic design at an abstract level using the intuitive user interface of the HLMS. In addition, the HLMS permits the designer to simulate the electronic design and translate the abstract specification of the electronic design into a hardware description language (HDL) for subsequent synthesis and production of a hardware implementation of the electronic design.

Various software tools may be used to translate a specification of the electronic design. For example, an HDL compiler may translate the abstract specification of the electronic design into an HDL specification of the electronic design. The electronic design may be represented by one or more directed graphs in each of these software tools; however, each of these software tools may require a customized directed graph with a specific structure.

Multiple customized directed graphs may need to be constructed for the algorithmic manipulations of the electronic design by the various software tools. A customized directed graph for a particular software tool may be initially constructed as a copy of another directed graph, such as a directed graph representing the connectivity between the basic elements of the abstract specification of the electronic design. The copied directed graph may be manipulated according to the processes of the particular software tool. Alternatively, when two software tools receive and modify the same directed graph, the modifications by one software tool may be undone before the other software tool receives the directed graph.

The copying of directed graphs and the journaling or other approaches used to undo modifications of directed graphs may be time-consuming and difficult. In addition, information generated by the software tools may need to be transferred between the various customized directed graphs. This information may include parameters defining the behavior of the basic elements of the electronic design, such as the blocks, ports, and networks of the electronic design. Many of the software tools may determine the values of respective parameters defining the behavior of the basic elements of the electronic design. The values of these parameters may need to be collected together before the behavior of each basic element is fully defined.

The present invention may address one or more of the above issues.

SUMMARY OF THE INVENTION

Various embodiments of the invention provide a method for processing an electronic design in a high level modeling system (HLMS). A first graph of a first type is generated, with each node of the first graph representing a respective basic element of the electronic design and each edge of the first graph between a pair of nodes representing an association between the respective basic elements of the pair of nodes. One of the nodes of the first graph is a shared node that represents the respective basic element that is a block, a port, or a network of the electronic design. Multiple second-type graphs are generated, with each second-type graph modeling a different aspect of the electronic design in the HLMS. Each second type graph includes nodes and edges, with each member of a subset of the nodes and edges associated with at least one of the nodes of the first graph. A first member of the subset of the nodes and edges of one of the second-type graphs is associated with the shared node of the first graph, and a second member of the subset of the nodes and edges of another of the second-type graphs is also associated with the shared node of the first graph. The different aspects of the electronic design of the second-type graphs transformed, with a first attribute of the different aspect of the one of the second type graphs is written to the shared node using the first member, and a second attribute of the different aspect of the another of the second-type graphs is determined as a function of the first attribute read from the shared node using the second member.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Instead of copying or other methods of managing multiple views of different aspects of an electronic design in a high-level modeling system (HLMS), various embodiments provide two layers of graphs for representing the multiple views of the electronic design. A low-level graph may represent the basic structure of the electronic design that is shared between the views. Each view may have a corresponding high-level graph that specifies certain details that are added and/or omitted from the low-level graph. During the manipulation of the electronic design by the software tool for a particular view, the corresponding high-level graph may be transformed, for example, by adding and/or deleting nodes and/or edges of the high-level graph; however, nodes and edges are not added nor deleted from the low-level graph during the various transformations of the high-level graphs. Thus, the basic structure of the electronic design that is represented by the low-level graph may be invariant during the manipulations of the electronic design by the various software tools.

While the nodes and edges present in the low-level graph may be constant during these manipulations of the electronic design, the contents of these nodes and edges may be modified. An example high-level graph for a software tool may be initialized to have a node corresponding to each node in the low-level graph, with each node in the high-level graph including customization information unique to the software tool and a reference to the corresponding node in the low-level graph. The customization information may be used to determine a value of an attribute or property of the electronic design and this attribute or property may be stored in a parameter of a node of the low-level graph. The high-level graph for each software tool may include customization information unique to the software tool while information that is shared between software tools may be stored in the nodes and/or edges of the low-level graph. Because each high-level graph does not duplicate information that is stored in the low-level graph, the electronic design may be efficiently manipulated by the various software tools.

Figure 1:
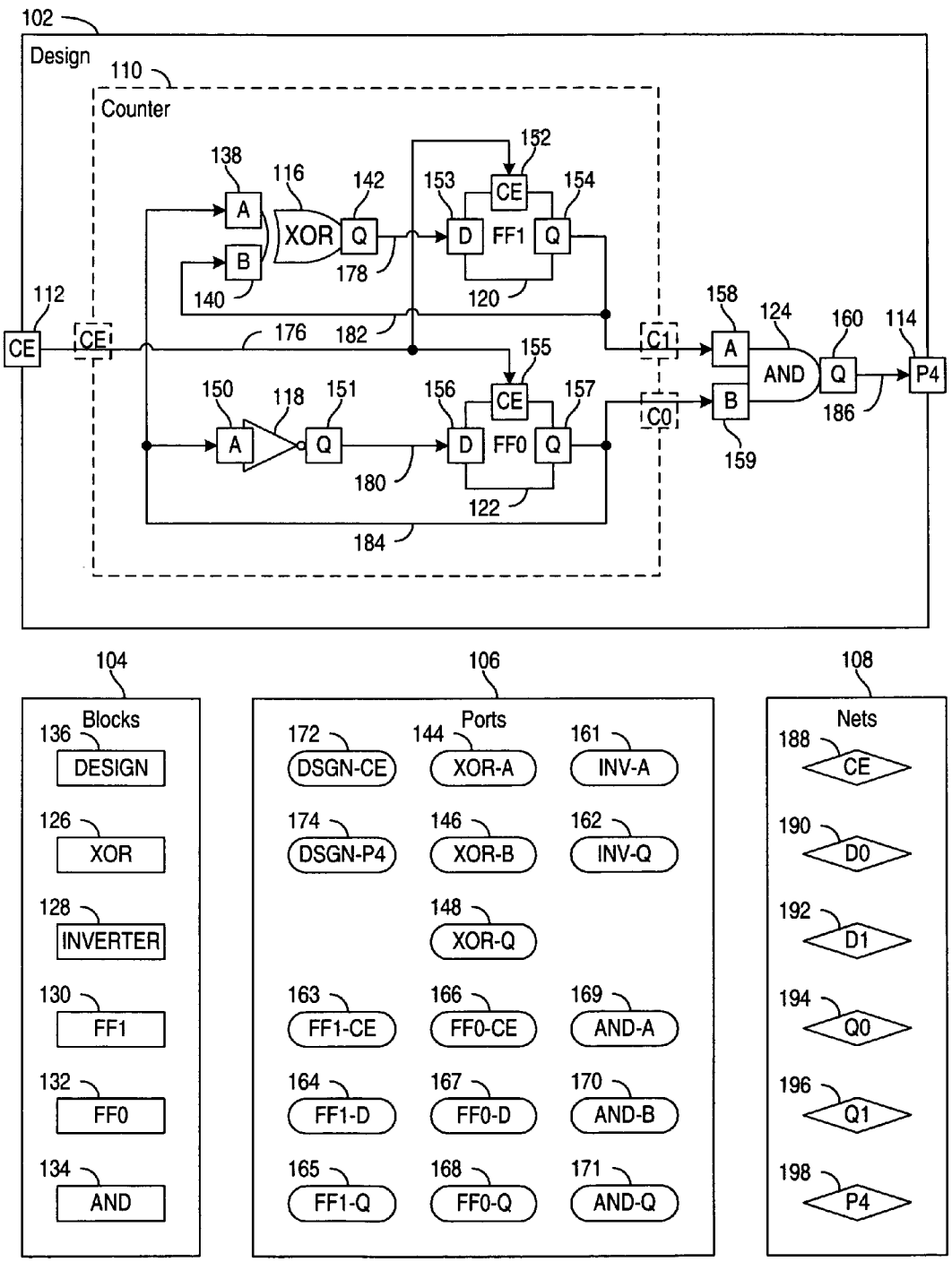
FIG. 1 is a block diagram of an example electronic design and corresponding containers for basic elements of the electronic design in accordance with various embodiments of the invention.

FIG. 1 is a block diagram of an example electronic design 102 and corresponding containers 104, 106, and 108 for basic elements of the electronic design in accordance with various embodiments of the invention. The electronic design 102 may include various basic elements that are represented by the nodes within containers 104, 106, and 108. Containers 104, 106, and 108 may include nodes representing the basic elements that are blocks, ports, and networks of the electronic design 102, respectively.

The example electronic design 102 may be created in a high-level modeling system (HLMS). The user may specify that the electronic design 102 includes a subsystem 110 that may provide various types of counters, and the user may also directly or indirectly specify data rates and types establishing that the counter subsystem 110 is a two-bit binary counter. The user may specify that an input port 112 of the electronic design 102 enables the counter subsystem 110 and an output port 114 of the electronic design 102 is active whenever the counter subsystem 110 has a value of three.

The example electronic design 102 includes blocks of XOR gate 116, inverter 118, flip-flops 120 and 122, and AND gate 124 that are respectively represented in the low-level graph by nodes 126, 128, 130, 132, and 134 of block container 104. In one embodiment, the block container 104 may also include a node 136 for the electronic design 102. In another embodiment, a subsystem container (not shown) may include a node for the electronic design 102 and a node for the counter subsystem 110. The XOR gate 116 has associated basic elements of input ports 138 and 140 and output port 142 that are respectively represented in the low-level graph by the nodes 144, 146, and 148. Similarly, inverter 118, flip-flops 120 and 122, and AND gate 124 have ports 150 through 160 that are respectively represented in the low-level graph by nodes 161 through 171 of port container 106. The port container 106 may also include nodes 172 and 174 for ports 112 and 114 of the electronic design 102. The electronic design 102 also includes networks on lines 176 through 186 that are represented in the low-level graph by nodes 188 through 198 of the network container 108.

Figure 2:
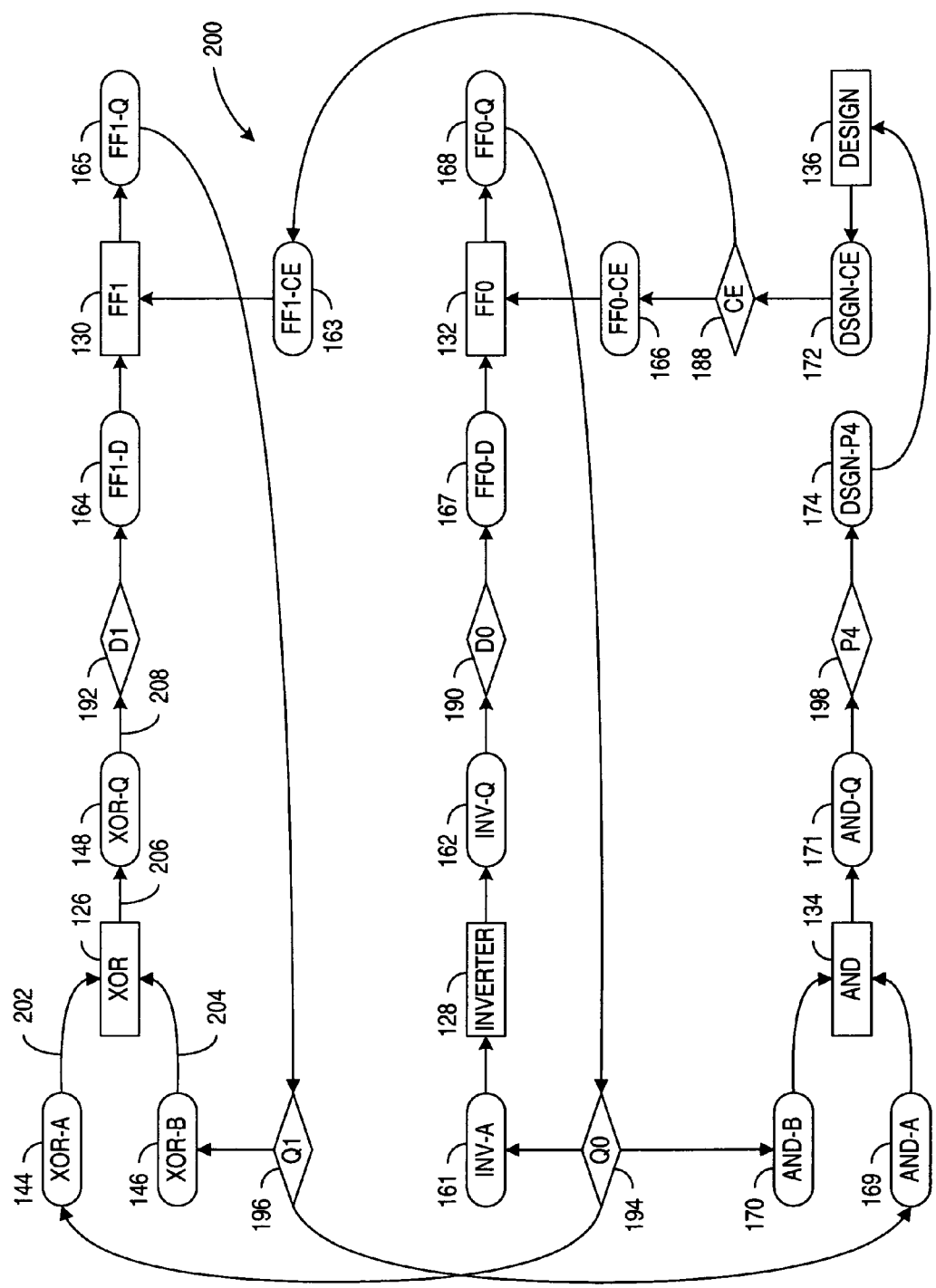
FIG. 2 is a block diagram of an example low-level graph representing the invariant connectivity between the basic elements of the example electronic design of FIG. 1.

FIG. 2 is a block diagram of an example low-level graph 200 representing the invariant connectivity between the basic elements of the example electronic design of FIG. 1. The invariant connectivity may be the basic structure of the electronic design, and the nodes and edges of the low-level graph 200 may be maintained throughout the processing of the electronic design by various software tools. For purposes of clarity, the containers 104, 106, and 108 shown in FIG. 1 are omitted from FIG. 2; however, the shape of each node in FIG. 2 matches a node type which determines the container that includes the node.

The nodes 126 through 136 represent the basic elements that are the blocks of the electronic design, the nodes 144 through 174 of FIG. 2 represent the basic elements that are the ports of the electronic design, and the nodes 188 through 198 represent the basic elements that are the networks of the electronic design. Certain pairs of the nodes 126 through 198 of FIG. 2 are associated by the edges of the low-level graph, and these edges represent an association between the basic elements for the pair of nodes. For example, edge 202 between nodes 144 and 126 represents an association between the basic element represented by node 144 and the basic element represented by node 126.

An edge between the node for a port and a node for a block may represent the association that the block has the port. For example, the edges that include node 126 for the XOR block are the three edges 202, 204, and 206, and these edges may represent the association that the XOR block has the three ports represented by nodes 144, 146, and 148. In one embodiment, the low-level graph 200 is a directed graph, and for each input port of a block, the low-level graph 200 has an edge from the node for the input port to the node for a block, and for each output port of a block, the low-level graph 200 has an edge from the node for the block to the node for the output port. Thus, the ports for nodes 144 and 146 may be input ports of the XOR block for node 126, and the port for node 148 may be an output port of the XOR block for node 126. Similarly, an edge of the low-level graph 200 between the node for a port and a node for a network may represent the associated that the network connects to the port. For example, edge 208 between node 148 and node 192 may represent the association that the network D1 is connected to the output port of the XOR block. For a directed graph, the direction of the edge may indicate whether or not the network is driven by the port.

The low-level graph 200 may include additional nodes and edges (not shown) representing the hierarchy of the electronic design. For example, an additional edge from node 136 to node 134 may represent the association that the electronic design includes the AND block represented by node 134. The low-level graph may include an additional node representing the counter subsystem 110 of FIG. 1, with an additional edge from node 136 to the counter subsystem's node representing that the electronic design includes the counter subsystem, and with additional edges from the counter subsystem's node to nodes 126, 128, 130, and 132 representing that the counter subsystem 110 of FIG. 1 respectively includes the blocks of XOR gate 116, inverter 118, and flip-flops 120 and 122 of FIG. 1. It will be appreciated that because subsystems may have ports that are connected to nets, the low-level graph may include additional nodes for the ports of subsystems and additional edges to associate the ports with the subsystems and the connected networks. Thus, the low-level graph 200 may include a sub-graph representing a "flattened" version of the connectivity of the electronic design as shown, and another sub-graph (not shown) representing the hierarchy of the blocks and subsystems of the electronic design.

Figure 3:
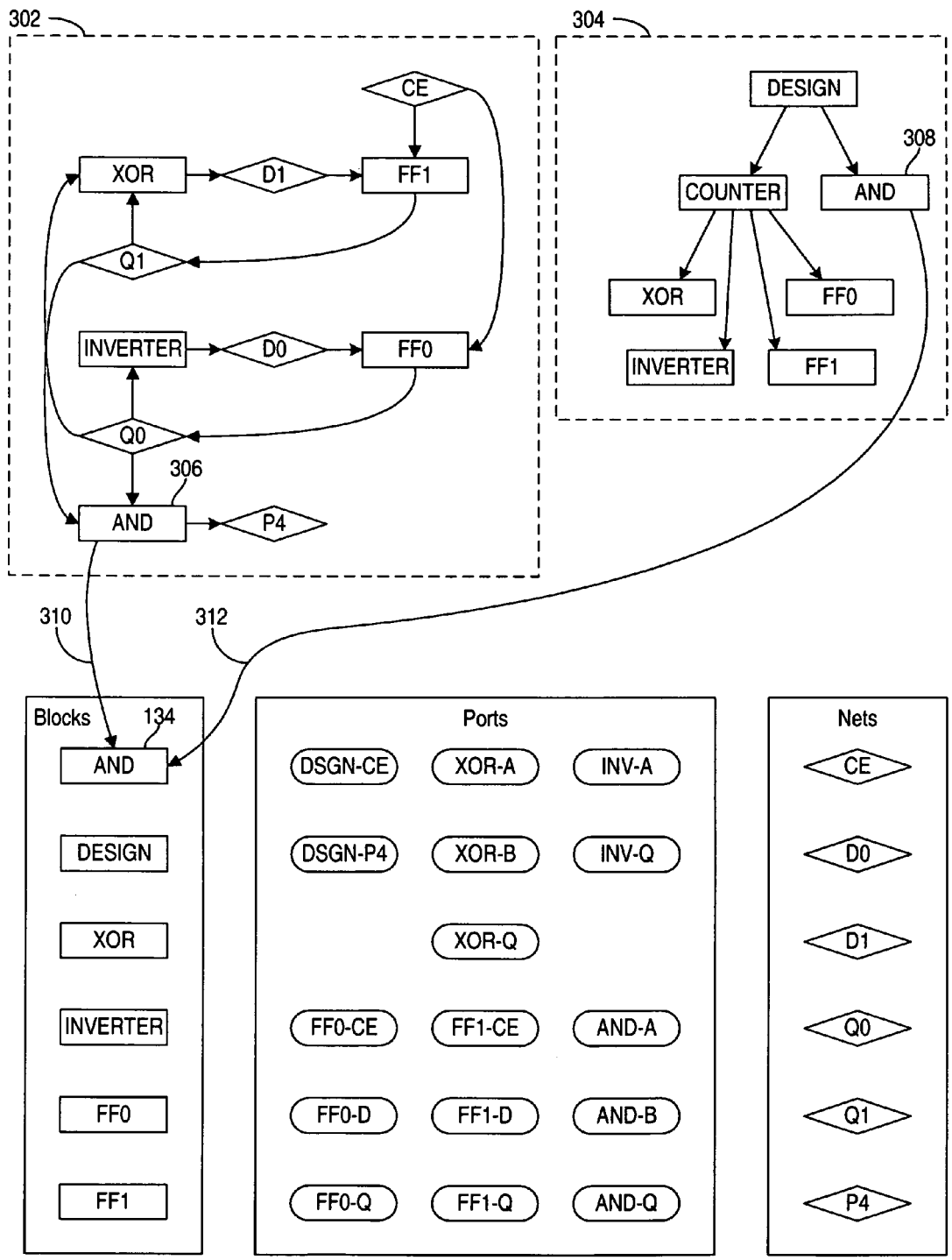
FIG. 3 is a block diagram of example high-level graphs that are associated with the low-level graph of FIG. 2 for the example electronic design of FIG. 1.

FIG. 3 is a block diagram of example high-level graphs 302 and 304 that are associated with the low-level graph of FIG. 2 for the example electronic design of FIG. 1. The high-level graph 304 may represent the hierarchy of the electronic design, and the high-level graph 302 may represent the abstraction of a flattening of the electronic design that omits the ports of the electronic design. While the example high-level graphs 302 and 304 may be abstractions that omit certain details of the low-level graph for the electronic design, it will be appreciated that a high-level graph may have certain nodes and/or edges that do not have corresponding counterparts in the low-level graph.

The high-level graph 302 may be used by a software tool that determines data types and data rates for each basic element of the electronic design from user-specified data types and data rates for a portion of the basic elements of the electronic design. The software tool may transform the high-level graph 302 by first identifying a non-cyclic component and any strongly connected components of the high-level graph 302, and then removing edges from the high-level graph 302 to eliminate the cycles of the strongly connected components and transform each strongly connected component into a non-cyclic component. The user-specified data types and rates may be propagated through the non-cyclic components to determine the data types and data rates for the basic elements of the electronic design.

The high-level graph 304 may be used by an HDL compiler that translates an abstract specification of the electronic design from a high-level modeling system into an HDL specification of the electronic design. An HDL specification of the electronic design that preserves the hierarchy of the electronic design from the high-level modeling system may be more readily understood by the user of the high-level modeling system. The high-level graph 304 may be used by the HDL compiler to direct the generation of a module for each subsystem of the electronic design.

Another high-level graph that is a flattening of the electronic design similar to low-level graph 200 of FIG. 2 may be used to translate the abstract specification of the electronic design from the high-level modeling system into a simulation model for the electronic design.

The software for determining data types and rates, the HDL compiler, and the software for generating a simulation model provide examples of the many kinds of algorithmic manipulations of the electronic design. A frequently occurring manipulation for the various software tools is the generation of a customized high-level graph followed by a transformation that partitions the nodes and/or edges of the high-level graph into disjoint subsets. For example, the software for determining data types and data rates may partition the high-level graph into a subset for the non-cyclic component and a respective subset for each strongly connected component. Similarly, the HDL compiler may partition the high-level graph according to the hierarchy of the electronic design. Because certain of the nodes and/or edges of a high-level graph may be associated with the nodes and/or edges of the low-level graph, the partitioning of the high-level graph may also provide a partitioning of the low-level graph.

Node 306 of high-level graph 302 may be associated with node 134 of the low-level graph, and node 308 of the high-level graph 304 also may be associated with node 134 of the low-level graph. Node 306 may be associated with node 134 using a reference on line 310, which may be a pointer or a reference of an objected-oriented programming language that is stored within node 306. Node 308 may be associated with node 134 using a similar reference on line 312.

The software for determining data types and rates may store the data type and data rate for node 306 in node 134 of the low-level graph using the reference on line 310. The HDL compiler may read the data type and data rate using the reference on line 312. Thus, node 134 of the low-level graph may be used to transfer information between the software tool for high-level graph 302 and the software tool for high-level graph 304. Information may be similarly transferred between various software tools using various other nodes and/or edges of the low-level graph.

In one embodiment, the HDL compiler may translate the electronic design into an HDL specification after the data rates and types are fully determined. In another embodiment, the HDL compiler may translate the electronic design into an HDL specification concurrently with determining the data types and data rates for the basic elements of the electronic design. A portion of the basic elements may have user-specified data types and data rates, while the remainder of the data types and data rates may be initialized to a value of "unknown." The HDL compiler may generate a module of the HDL specification for each subsystem of the electronic design that does not include any data types and data rates with a value of "unknown" concurrently with the determination of the data types and data rates for the other basic elements of the electronic design. As additional data types and data rates are determined, additional subsystems may become enabled for generation by the HDL compiler of the corresponding module of the HDL specification.

Figure 4:
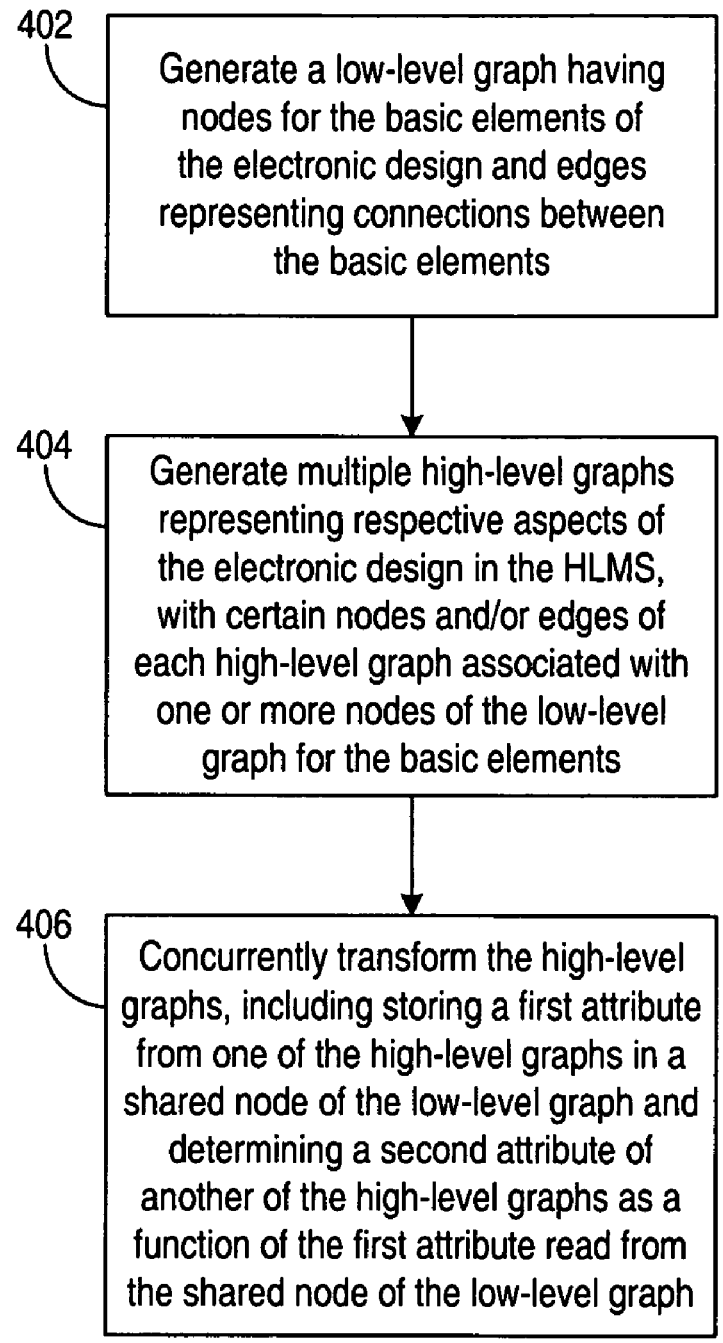
FIG. 4 is a flow diagram of a process for transforming various aspects of an electronic design in a high level modeling system in accordance with various embodiments of the invention.

FIG. 4 is a flow diagram of a process for transforming various aspects of an electronic design in a high level modeling system (HLMS) in accordance with various embodiments of the invention. The electronic design may be represented by a low-level graph for the basic structure of the electronic design and a high-level graph for each view of a different aspect of the electronic design. Information specific to a particular aspect of the electronic design may be stored in the high-level graph and information shared between multiple aspects of the electronic design may be stored in the low-level graph. Example views of the electronic design may include a specification of the electronic design in the HLMS, a tree showing the hierarchy of the electronic design, and a flattened view of the connectivity between the blocks of the electronic design.

At step 402, a low-level graph may be generated that has nodes representing the basic elements of the electronic design and edges representing associations between two of the basic elements. Each node of the low-level graph may represent a basic element that is a block, a port, a network, or a subsystem of the electronic design.

At step 404, multiple high-level graphs are generated with each high-level graph modeling a different aspect of the electronic design. Certain of the nodes and/or edges of each high-level graph are associated with one or more nodes of the low-level graph for the basic elements. For example, a node or edge of a high-level graph may be associated with a particular node of the level-graph graph and a node or edge of another high-level graph may also be associated with the particular node of the low-level graph. Thus, the particular node of the low-level graph may be a shared node that is associated with a node or edge of two or more of the high-level graphs. It will be appreciated that the low-level graph may include many nodes that are each associated with a node or edge of multiple high-level graphs.

At step 406, the aspect of the electronic design for each of the high-level graphs is transformed by a software tool that performs processing of the aspect. The transformations of step 406 for two high-level graphs include transferring information between these two high-level graphs using a shared node of the low-level graph. A software tool for an aspect of the electronic design may determine an attribute for the aspect and the software tool may store the attribute in the shared node using a reference that associates the shared node with a node or edge of a high-level graph. Another software tool for another aspect of the electronic design may read the attribute from the shared node using a reference that associates the shared node with a node or edge of another high-level graph and this attribute may be used to determine another attribute.

Figure 5:
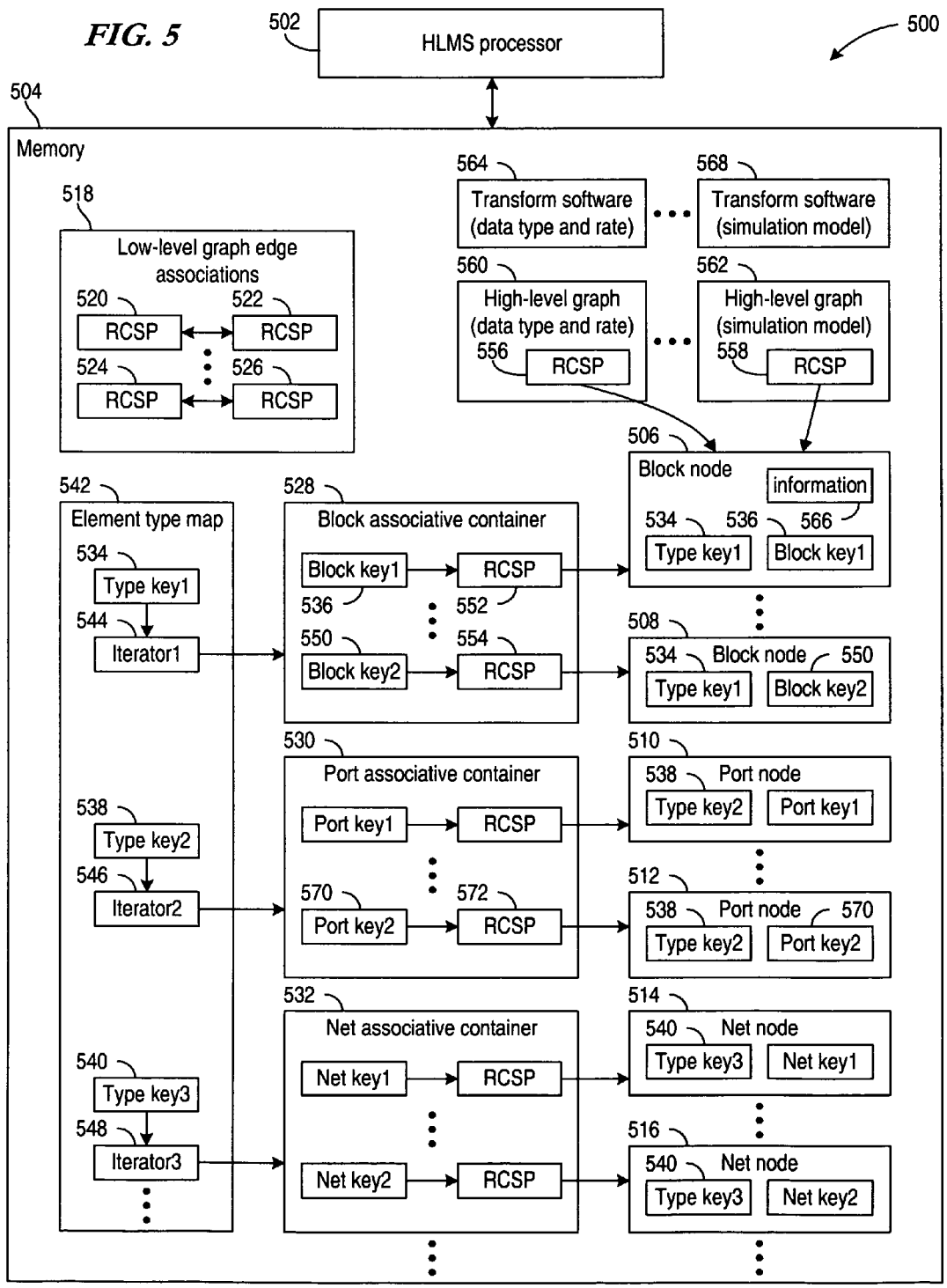
FIG. 5 is a block diagram of a system for transforming high-level graphs 560 representing different aspects of an electronic design in a high level modeling system in accordance with various embodiments of the invention.

FIG. 5 is a block diagram of a system 500 for transforming high-level graphs 560 and 562 representing different aspects of an electronic design in a high level modeling system (HLMS) in accordance with various embodiments of the invention. The system 500 includes at least one processor 502 for transforming each high-level graph representing a different aspect of the electronic design. Various data structures in memory 504 of the system 500 are used to represent the high-level graphs 560 and 562 and also a low-level graph that represents the invariant connectivity or basic structure of the electronic design.

The low-level graph includes nodes that represent each basic element of the electronic design, and these nodes include nodes 506 and 508 representing blocks of the electronic design, nodes 510 and 512 representing ports of the electronic design, and nodes 514 and 516 representing networks of the electronic design. It will be appreciated that the electronic design may include other the basic elements, such as subsystems, having corresponding nodes. The low-level graph also includes edges, with each edge representing an association between two of the basic elements of the electronic design. One edge of the low-level graph is specified in edge associations 518 as a pairing of reference counting shared pointer 520 and reference counting shared pointer 522, and another edge of the low-level graph is specified in edge associations 518 as a pairing of reference counting shared pointer 524 and reference counting shared pointer 526. Edge associations 518 may be a list including a pair of associated reference counting shared pointers for each edge in the low-level graph, and each pair may identify the two nodes for an edge of the low-level graph.

Each of nodes 506 through 516 of the low-level graph may have a combination of a type key and an element key that identifies the node. For example, block node 506 of the low-level graph may have a type key 534 and a block element key 536 that may be stored within the block node 506. It will be appreciated that storage of the type key 534 and the element key 536 within the block node 506 is not required for the combination of the type key 534 and the element key 536 to identify the node 506 of the low-level graph. The types of block, port, and net for the basic elements of the electronic design may have respective type keys 534, 538, and 540, and the associative container 542 may respectively map the type keys 534, 538, and 540 to the element associative containers 528, 530, and 532 via iterators 544, 546, and 548. Block element associative container 528 may respectively map the element keys 536 and 550 to the block nodes 506 and 508 via the reference counting shared pointers 552 and 554. Port and network associative containers 530 and 532 may similarly map element keys to the port nodes 510 and 512 and the network nodes 514 and 516.

The storage in memory 504 for the nodes 506 through 516 may be allocated from a heap (not shown). Reference counting shared pointers may be used to track the outstanding references to each of nodes 506 through 516. For example, node 506 is shown as having three references from reference counting shared pointers 552, 556, and 558, such that the reference count for node 506 is three. As additional references are created the reference count is incremented and as references are destroyed the reference count is decremented. When the reference count is decremented to zero upon destroying the last reference to a node, the storage in memory 504 for the node may be returned to the heap. Because the high-level graphs 560 and 562 may include references to the nodes 506 through 516 of the low-level graph instead of copying information from these nodes, efficiency is improved for generating and transforming the high-level graphs 560 and 562.

In certain embodiments of the invention, the low-level graph may have a static allocation of the nodes 506 through 516 between the creation and the destruction of the low-level graph, and the transforming of the high-level graphs 560 and 562 may occur during the static allocation of the low-level graph. However, it will be appreciated that reference counting shared pointers 556 and 558 may continue to exist following the destruction of the low-level graph, and the usage of reference counting shared pointers may prevent the deallocation of node 506 until after the destruction of both of reference counting shared pointers 556 and 558. Thus, reference counting protects against invalid pointer access and is exception safe because after the generation of an exception, deallocation is handled in the destructor instead of in a special exception handler.

The high-level graph 560 may model the aspect of the data type and data rate for certain basic elements of the electronic design. A node or edge of the high-level graph 560 may include the reference counting shared pointer 556 that references the block node 506 of the low-level graph. The transformation software 564 executed by processor 502 may determine a data rate and a data type for the block node 506 and may store this data rate and data type in attribute 566. The transformation software 568 executed by processor 502 may read the data rate and data type from attribute 566 and use the attribute 566 to generate a simulation model for the electronic design. Thus, information, such as attribute 566, may be shared between transformation software 564 and 568 via nodes 506 through 516 of the low-level graph.

In one embodiment of the invention, the low-level graph is represented in memory 504 with data structures illustrated in FIG. 5 and the high-level graphs 560 and 562 are represented in memory 504 using the publicly available Boost Graph Library. The Boost Graph Library is a generic library of high quality graph data structures and algorithms distributed freely under the Boost Public License. The Boost Graph Library permits an arbitrary data structure to be associated with a node or edge of a high-level graph that is managed using the Boost Graph Library. Such an arbitrary data structure association may be used, for example, to associate the reference counting shared pointer 556 with a node or edge of the high-level graph 560.

The data structures for the low-level graph effectively store the basic elements of the electronic design in managed object pools (containers 528, 530, and 532) with shared ownership semantics. Associations between the basic elements, such as the association represented by the pairing of reference counting shared pointer 520 and reference counting shared pointer 522 from edge associations 518, may be established and destroyed using a generic application interface. For the association of two basic elements, the generic application interface may accept respective references to the two basic elements from the associative containers 528, 530, and 532.

The managed object pools may be implemented as C++ associative containers 528, 530, and 532 with various template declarations for the types of the basic elements of the electronic design. Each member of the managed object pool may include an object key that uniquely identifies the associative container including the member of the managed object pool in addition to uniquely identifying the member. For example, stored within node 512 are a type key 538 and an element key 570 that together form the object key of node 512, with the type key 538 identifying node 512 as a member of associative container 530 and element key 570 identifying node 512 in associative container 530 via reference counting shared pointer 572.

A generic application interface may be used to create associations between managed objects because the globally unique object key specifies the container for the object in addition to the object itself. By storing this globally unique object key in the object itself, a reference to the object may also provide the object key for the object. Object associations may be bi-directional and maintained by storing lists of associated object keys or references thereto. Example 1 illustrates usage of a generic interface for establishing associations between the managed objects of a block and three ports of the block.

EXAMPLE 1

```
// Maps are instantiated at first use
BlockDescMap*    block_map    =    MapManager::get<BlockDescMap>("BlockDescMap");
PortDescMap*    port_map    =    MapManager::get<PortDescMap>("PortDescMap");
// Insert new block and its three ports into maps
BlockDescMap::iterator block_iter = block_map->insert_new( );
PortDescMap::iterator port_iter_1 = port_map->insert_new( );
PortDescMap::iterator port_iter_2 = port_map->insert_new( );
PortDescMap::iterator port_iter_3 = port_map->insert_new( );
// Associate block with its three ports
Key::associate(*block_iter, *port_iter_1);
Key::associate(*block_iter, *port_iter_2);
Key::associate(*block_iter, *port_iter 3);
```

Iterator interfaces are provided for access to associated objects and for direct access to objects in the managed object pools as shown in Example 2.

```
// For each block . . .
BlockMap*  block_map  =MapManager::get<BlockMap>("BlockMap");
BlockMap::iterator block_iter =block_map->range( );
while(BlockMap::pointer block_ptr =block_iter.next( )) {
boost::shared_ptr<Block> block =*block_ptr;
// Do something with the block
}
boost::shared_ptr<Block> *block_ptr = . . . ;
// For each port of the block . . .
PortMap::key_iterator    port_iter    =    block_ptr->get( )->get_associated<Port>( );
while(PortMap::pointer port_ptr = port_iter.next( )) {
boost::shared_ptr<Port>port = *port_ptr;
// Do something with the port
}
```

The iterators are bounded iterators with a domain of validity. When the current value of each iterator reaches the end of the domain of validity, each "next( )" method of Example 2 for the iterator returns null and the corresponding "while" loop terminates.

Figure 6:
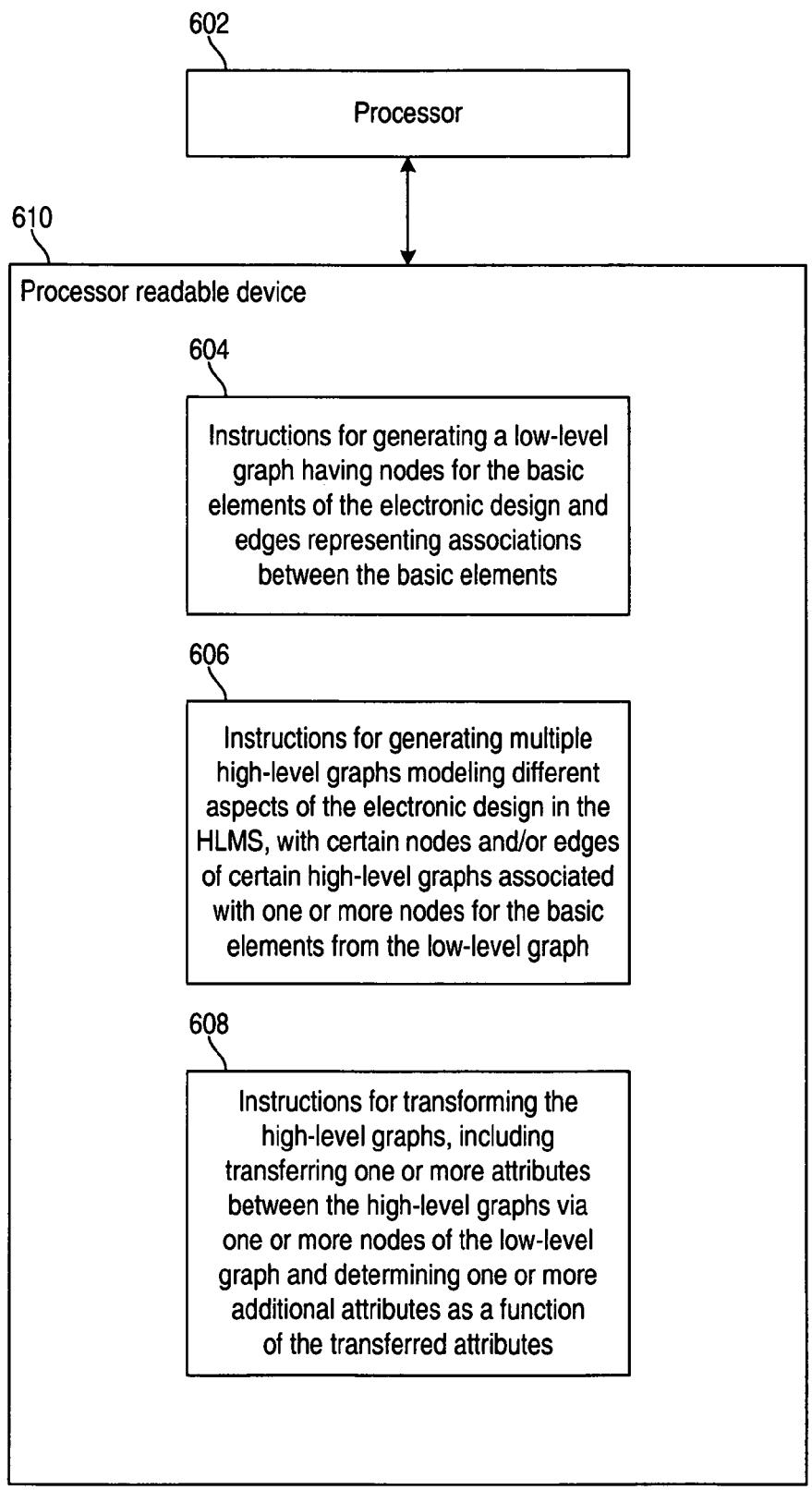
FIG. 6 is a block diagram illustrating a program storage medium for transforming high-level graphs representing respective aspects of an electronic design in a high level modeling system in accordance with various embodiments of the invention.

FIG. 6 is a block diagram illustrating a program storage medium for transforming high-level graphs representing respective aspects of an electronic design in a high level modeling system (HLMS) in accordance with various embodiments of the invention. A processor 602 may execute instructions from software modules 604, 606, and 608 of a processor-readable device 610. The processor-readable device 610 may be configured with instructions for processing an electronic design in a high level modeling system (HLMS).

Execution of the instructions from software module 604 may cause processor 602 to generate a low-level graph representing the invariant connectivity of the electronic design in the HLMS. The low-level graph generated by software module 604 may includes nodes representing the basic elements of the electronic design and edges representing associations between the basic elements.

Execution of the instructions from software module 606 may cause processor 602 to generate multiple high-level graphs that each model different aspects of the electronic design in the HLMS. Certain nodes and/or edges of certain of the high-level graphs may be associated with one or more nodes for the basic elements from the low-level graph.

Execution of the instructions from software module 608 may cause processor 602 to transform the high-level graphs. The transformation of a high-level graph may determine attributes of the electronic design that may be stored in certain nodes of the low-level graph, and these attributes of the electronic design may be determined as a function of other attributes read from the nodes of the low-level graph. Attributes may be transferred between the high-level graphs via the nodes of the low-level graph.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for processing an electronic design. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for processing an electronic design in a high level modeling system (HLMS), comprising:

generating a first graph of a first type including a plurality of nodes and a plurality of edges, each node representing a respective basic element of the electronic design in the HLMS and each edge between two of the nodes representing an association between the respective basic elements of the two of the nodes, wherein one of the nodes is a shared node that represents the respective basic element that is one of a block, a port, or a network of the electronic design;

generating a plurality of second-type graphs, each second-type graph modeling a different aspect of the electronic design in the HLMS, each second-type graph including a plurality of nodes and a plurality of edges, wherein a first member of a subset of the nodes and edges of one of the second-type graphs is associated with the shared node of the first graph, and a second member of the subset of the nodes and edges of another of the second-type graphs is also associated with the shared node of the first graph; and transforming the different aspects of the electronic design of the second-type graphs, the transforming including writing a first attribute of the different aspect of the one of the second-type graphs to the shared node using the first member, and determining a second attribute of the different aspect of the another of the second-type graphs as a function of the first attribute read from the shared node using the second member, wherein each member of the subset of the nodes and edges of each second-type graph is associated with each of the at least one node of the first graph by a respective reference, and wherein the writing of the first attribute to the shared node includes dereferencing the respective reference that associates the first member with the shared node, and the determining of the second attribute includes reading the first attribute from the shared node and the reading of the first attribute from the shared node includes dereferencing the respective reference that associates the second member with the shared node.

2. The method of claim 1, wherein the basic elements include each subsystem, block, port, and network of the electronic design, and for each basic element the first graph includes a node representing the basic element.

3. The method of claim 2, wherein:

for each port of each network of the electronic design, the first graph includes an edge between the node for the network and the node for the port, the edge representing the association that the network connects to the port, for each port of each block of the electronic design, the first graph includes an edge between the node for the block and the node for the port, the edge representing the association that the block has the port, for each port of each subsystem of the electronic design, the first graph includes an edge between the node for the subsystem and the node for the port, the edge representing the association that the subsystem has the port, for each block of each subsystem of the electronic design, the first graph includes an edge between the node for the subsystem and the node for the block, the edge representing the association that the subsystem includes the block, and for each first subsystem of each second subsystem of the electronic design, the first graph includes an edge between the node for the second subsystem and the node for the first subsystem, the edge representing the association that the second subsystem includes the first subsystem.

4. The method of claim 1, wherein for each of at least one of the second-type graphs, the generating of the second-type graph includes generating, for each node of the first graph, a respective node of the second-type graph that is associated with the node of the first graph.

5. The method of claim 1, wherein the associations between the basic elements of the edges of the first graph are invariant during the transforming of the different aspects of the electronic design of the second-type graphs.

6. The method of claim 1, wherein the transforming of the different aspects of the electronic design of the second-type graphs includes concurrently transforming the different aspects of the electronic design of the one and the another of the second-type graphs.

7. The method of claim 1, wherein the transforming of the different aspects of the electronic design for the second-type graphs includes, for one of the second-type graphs, partitioning the nodes of the second-type graph into a plurality of disjoint subsets.

8. The method of claim 1, wherein the one of the second-type graphs models the different aspect of the electronic design that is a data rate and a data type for each basic element in a subset of the basic elements of the electronic design.

9. The method of claim 8, wherein the transforming of the different aspects of the electronic design of the second-type graphs includes determining a first value of the data rate and a second value of the data type for each basic element in the subset, and the writing of the first attribute to the shared node includes writing to the shared node the first and second values of the respective basic element represented by the shared node.

10. The method of claim 9, wherein the another of the second-type graphs models the different aspect of the electronic design that is a simulation model of the electronic design and the determining of the second attribute includes reading the first and second values of the data rate and data type of the respective basic element represented by the shared node and specifying the first value of the data rate and the second value of the data type in the simulation model.

11. A program storage medium, comprising:

a processor-readable device configured with instructions for processing an electronic design in a high level modeling system (HLMS), wherein execution of the instructions by one or more processors causes the one or more processors to perform operations including, generating a first graph of a first type including a plurality of nodes and a plurality of edges, each node representing a respective basic element of the electronic design in the HLMS and each edge between two of the nodes representing an association between the respective basic elements of the two of the nodes, wherein one of the nodes is a shared node that represents the respective basic element that is one of a block, a port, or a network of the electronic design;

generating a plurality of second-type graphs, each second-type graph modeling a different aspect of the electronic design in the HLMS, each second-type graph including a plurality of nodes and a plurality of edges with each member of a subset of the nodes and edges associated with at least one of the nodes of the first graph, wherein a member of the subset of the nodes and edges of one and another of the second-type graphs is associated with the shared node of the first graph; and transforming the different aspects of the electronic design of the second-type graphs, the transforming including writing to the shared node of the first graph a first attribute of the different aspect for the one of the second-type graphs and determining a second attribute of the different aspect for the another of the second-type graphs as a function of the first attribute read from the shared node of the first graph, wherein each member of the subset of the nodes and edges of each second-type graph is associated with each of the at least one node of the first graph by a respective reference, and the writing of the first attribute to the shared node includes dereferencing the respective reference that associates the first member with the shared node, and the determining of the second attribute includes reading the first attribute from the shared node and the reading of the first attribute from the shared node includes dereferencing the respective reference that associates the second member with the shared node.

12. The program storage medium of claim 11, wherein the basic elements include each subsystem, block, port, and network of the electronic design, and for each basic element the first graph includes a node representing the basic element.

13. A system for processing an electronic design, the system comprising:
a memory arranged to represent a first graph of a first type and a plurality of second-type graphs, the first graph including a plurality of edges and a plurality of nodes, which include a shared node, each node representing a respective basic element of the electronic design and each edge representing an association between two of the basic elements, each second-type graph modeling a different aspect of the electronic design, each second-type graph including a plurality of nodes and a plurality of edges with each member of a subset of the nodes and edges having a respective reference to one of the nodes of the first graph, wherein a member of the subset of the nodes and edges for one and another of the second-type graphs respectively has a first and second reference to the shared node of the first graph; and
a processor adapted to transform, in the memory, the different aspects of the electronic design for the second-type graphs, including writing a first attribute of the different aspect for the one of the second-type graphs to the shared node using the first reference and determining a second attribute of the different aspect for the another of the second-type graphs as a function of the first attribute read from the shared node using the second reference, wherein the edges of the first graph, which represent the associations between the basic elements, are preserved, wherein each member of the subset of the nodes and edges of each second-type graph is associated with each of the at least one node of the first graph by a respective reference, and the writing of the first attribute to the shared node includes dereferencing the respective reference that associates the first member with the shared node, and the determining of the second attribute includes reading the first attribute from the shared node and the reading of the first attribute from the shared node includes dereferencing the respective reference that associates the second member with the shared node.

14. The system of claim 13, wherein the respective reference of each member of the subset for each second-type graph are represented in the memory using reference-counting shared pointers.

15. The system of claim 13, wherein each basic element of the electronic design has a type, and each type of the basic elements has a respective associative container in the memory that includes a third reference for each node of the first graph that represents the respective basic element having the type, each node of the first graph including a fourth reference back to the respective associate container for the type of the basic element that is represented by the node, each node of the first graph also including a fifth reference back to an entry in the respective associative container, the entry including a sixth reference to the node, the sixth reference being one of the third references.

16. The system of claim 15, wherein a list of pairs in the memory includes a respective pair for each edge of the first graph, the respective pair specifying the association between the two of the basic elements for the edge, the pair including a seventh and eight reference to the nodes of the first graph that represent the two of the basic elements.

* * * * *